United States Patent
Wu et al.

(10) Patent No.: US 7,907,070 B2
(45) Date of Patent: Mar. 15, 2011

(54) SYSTEMS AND METHODS FOR PROVIDING UNEQUAL ERROR PROTECTION USING EMBEDDED CODING

(75) Inventors: Huaming Wu, Vancouver, WA (US); Lizhong Zheng, Canton, MA (US)

(73) Assignee: Sharp Laboratories of America, Inc., Camas, WA (US)

( * ) Notice: Subject to any disclaimer, the term of this patent is extended or adjusted under 35 U.S.C. 154(b) by 12 days.

(21) Appl. No.: 12/210,082

(22) Filed: Sep. 12, 2008

(65) Prior Publication Data

US 2010/0066573 A1    Mar. 18, 2010

(51) Int. Cl.
H03M 7/00    (2006.01)
(52) U.S. Cl. .................. 341/60; 341/50; 341/51
(58) Field of Classification Search .......... 341/60, 341/50, 51; 370/465; 375/341
See application file for complete search history.

(56) References Cited

U.S. PATENT DOCUMENTS

| | | | |
|---|---|---|---|
| 5,305,352 A | 4/1994 | Calderbank et al. | |
| 6,236,960 B1 | 5/2001 | Peng et al. | |
| 6,400,728 B1 * | 6/2002 | Ott | 370/465 |
| 2003/0072395 A1 * | 4/2003 | Jia et al. | 375/341 |
| 2004/0083110 A1 | 4/2004 | Wang | |
| 2008/0013641 A1 | 1/2008 | Li et al. | |

FOREIGN PATENT DOCUMENTS

| | | |
|---|---|---|
| EP | 0 540 232 | 10/1992 |
| EP | 1 871 063 | 12/2007 |
| JP | 06-292160 | 10/1994 |
| JP | 2001-333121 | 11/2001 |
| JP | 2008-005502 | 1/2008 |
| WO | 01/15458 | 3/2001 |

OTHER PUBLICATIONS

NTT DoCoMo, "LS on Target Quality on L1L2 Control Channel," R1-071814, Mar. 2007.
Sharp, "Embedded Coding for PUCCH Transmissions of CQI+ACK/NACK," 3GPP TSG-RAN WG1 #50b, R1-074656, Nov. 2007.
International Search Report issued for International Patent Application No. PCT/JP2009/065968 on Dec. 22, 2009.
Von Deetzen, N., Henkel, W., "Unequal Error Protection Multilevel Codes and Hierarchical Modulation for Multimedia Transmission," IEEE International Symposium on Information Theory, 2008, pp. 2237-2241, Jul. 2008.

* cited by examiner

Primary Examiner — Jean B Jeanglaude
(74) Attorney, Agent, or Firm — Austin Rapp & Hardman

(57) ABSTRACT

A method for embedded encoding of at least two types of information. A first message and a second message are received. The types of a first encoder and a second encoder are determined. The rates of the first encoder and the second encoder are determined. A first codeword and a second codeword are generated. A mapping rule for the second codeword and a coding rule for the first codeword are determined. The second codeword is mapped into a plurality of symbols using the mapping rule. A third codeword is determined using the first codeword, the plurality of symbols, and the coding rule. The third codeword is then transmitted. The third codeword includes at least two types of information.

27 Claims, 10 Drawing Sheets

SYSTEMS AND METHODS FOR PROVIDING UNEQUAL ERROR PROTECTION USING EMBEDDED CODING

TECHNICAL FIELD

The present invention relates generally to wireless communications and wireless communications-related technology. More specifically, the present invention relates to systems and methods for providing unequal error protection using embedded coding.

BACKGROUND

A wireless communication system typically includes a base station in wireless communication with a plurality of user devices (which may also be referred to as user equipment, mobile stations, subscriber units, access terminals, etc.). The base station transmits data to the user devices over a radio frequency (RF) communication channel. The terms "downlink" and "forward link" refer to transmission from a base station to a user device, while the terms "uplink" and "reverse link" refer to transmission from a user device to a base station.

The 3$^{rd}$ Generation Partnership Project (3GPP) is a collaboration of standards organizations throughout the world. The goal of 3GPP is to make a globally applicable third generation (3G) mobile phone system specification within the scope of the IMT-2000 (International Mobile Telecommunications-2000) standard as defined by the International Telecommunication Union. The 3GPP Long Term Evolution ("LTE") Committee is considering Orthogonal Frequency Division Multiplexing (OFDM) as well as OFDM/OQAM (Orthogonal Frequency Division Multiplexing/Offset Quadrature Amplitude Modulation), as a method for downlink transmission, as well as OFDM transmission on the uplink.

Wireless communications systems (e.g., Time Division Multiple Access (TDMA), OFDM, Code Division Multiple Access (CDMA), Frequency Division Multiple Access (FDMA), etc.) may transmit a channel quality indicator signal (CQI), acknowledgment signals (ACK), negative acknowledgment signals (NAK), and many other types of signals. Performance may diminish and/or the acceptable error rates may increase depending on how the signals are coded. Accordingly, benefits may be realized by providing improved systems and methods for embedded coding.

DETAILED DESCRIPTION

Figure 1:
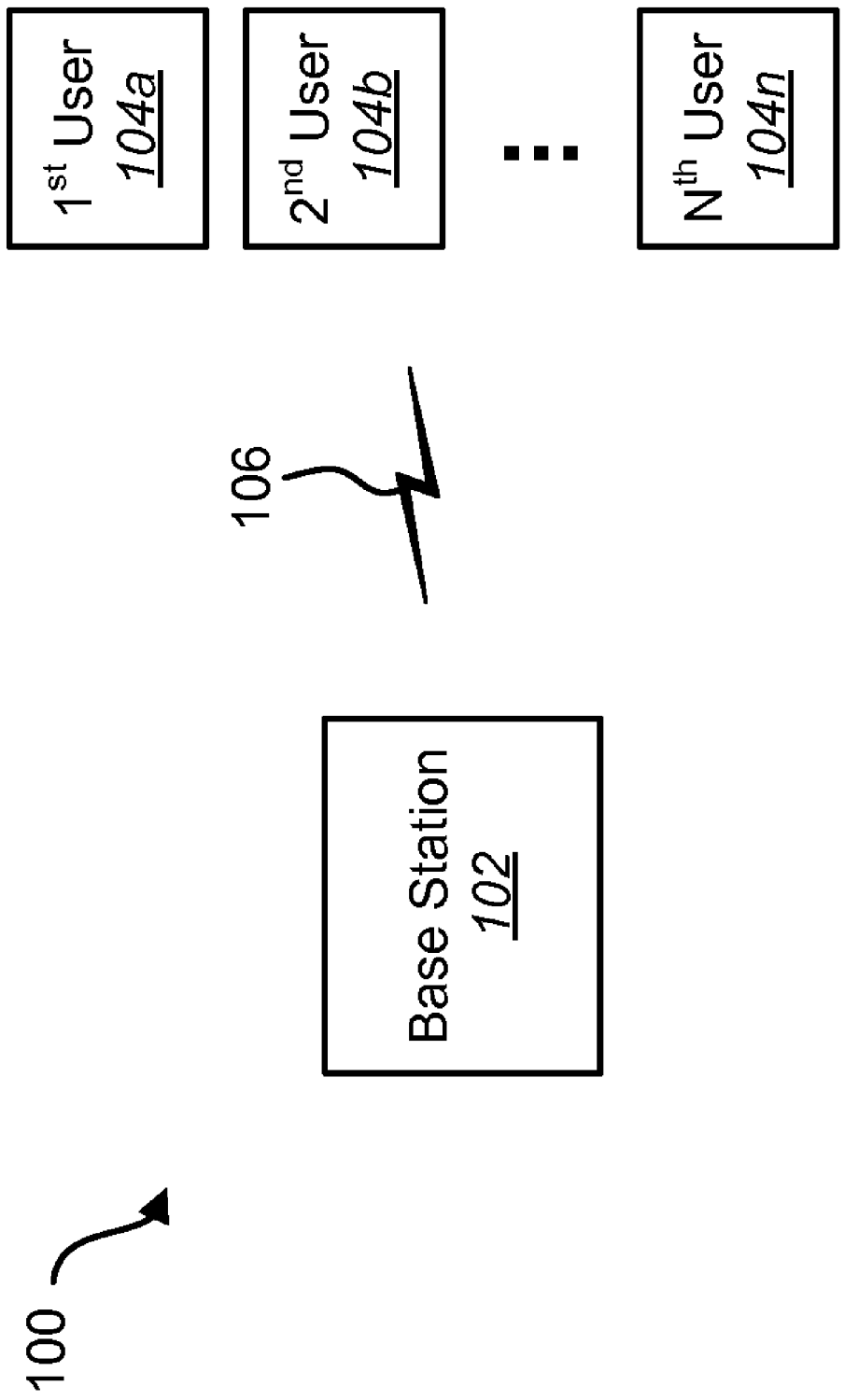
FIG. 1 is a block diagram illustrating a wireless communication system in which embodiments may be practiced.

A method for embedded encoding of at least two types of information is disclosed. The types of a first encoder and a second encoder are determined. The rates of the first encoder and the second encoder are determined. A first codeword and a second codeword are generated. A mapping rule is determined for the second codeword. A coding rule is determined for the first codeword. The second codeword is mapped into a plurality of symbols using the mapping rule. A third codeword is determined using the first codeword, the plurality of symbols, and the coding rule. The third codeword is transmitted. The third codeword includes at least two types of information.

A first message and a second message may require unequal error protection. The generating may comprise encoding a first message with the first encoder and encoding a second message with the second encoder. The first encoder may be an error-correcting code encoder. The second encoder may be an error-correcting code encoder. The first encoder may be a convolutional encoder. The second encoder may be a Turbo encoder. The symbols may be Quadrature Phase Shift Keying (QPSK) symbols. The coding rule may include instructions for rotating the plurality of symbols around a QPSK constellation based on the first codeword to produce the third codeword A method for embedded decoding of a signal conveying at least two messages is disclosed. A signal is received. A first decoding rule is determined for the signal. The signal is demodulated. The demodulated signal is decoded using the first decoding rule to produce a first message. The first message is encoded to produce a first codeword. The demodulated signal is demapped using the first codeword and a second decoding rule to produce a second codeword. The second codeword is decoded to produce a second message. The first decoding rule may be a probability distribution of the first codeword given a set of possible values for the signal.

An apparatus for embedded encoding of at least two types of information is disclosed. The apparatus includes a processor and memory in electronic communication with the processor. Executable instructions are stored in the memory. A first error-correcting encoder and a second error-correcting encoder are determined. The rates of the first encoder and the second encoder are determined. A first codeword and a second codeword are generated. A mapping rule is determined for the second codeword. A coding rule is determined for the first codeword. The second codeword is mapped into a plurality of symbols using the mapping rule. A third codeword is determined using the first codeword, the plurality of symbols, and the coding rule. The third codeword is transmitted. The third codeword includes at least two types of information.

An apparatus for embedded decoding of a signal conveying at least two messages is disclosed. The apparatus includes a processor and memory in electronic communication with the processor. Executable instructions are stored in the memory. A signal is received. A first decoding rule is determined for the signal. The signal is demodulated. The demodulated signal is decoded using the first decoding rule to produce a first message. The first message is encoded to produce a first codeword. The demodulated signal is demapped using the first codeword and a second decoding rule to produce a second codeword. The second codeword is decoded to produce a second message.

A computer-readable medium for embedded encoding of at least two types of information is disclosed. The computer-readable medium comprises executable instructions. The types of a first encoder and a second encoder are determined. The rates of the first encoder and the second encoder are determined. A first codeword and a second codeword are generated. A mapping rule is determined for the second codeword. A coding rule is determined for the first codeword. The second codeword is mapped into a plurality of symbols using the mapping rule. A third codeword is determined using the first codeword, the plurality of symbols, and the coding rule. The third codeword is transmitted. The third codeword includes at least two types of information.

A computer-readable medium for embedded decoding of a signal conveying at least two messages is disclosed. The computer-readable medium comprises executable instructions. A signal is received. A first decoding rule is determined for the signal. The signal is demodulated. The demodulated signal is decoded using the first decoding rule to produce a first message. The first message is encoded to produce a first codeword. The demodulated signal is demapped using the first codeword and a second decoding rule to produce a second codeword. The second codeword is decoded to produce a second message.

Channel coding, also known as forward error correction (FEC), is a system of error control for data transmission whereby a sender may add redundant data to a transmitted message. This may allow a receiver of the message to detect and correct errors in the message under some circumstances and within some boundaries. FEC may be accomplished by adding redundant data to the transmitted information using a predetermined algorithm. Traditionally, the emphasis in this type of coding has been the design of channel capacity approaching codes, e.g., Turbo codes and low-density parity-check (LDPC) codes. Therefore, the main question addressed by most researchers has been how to design codes that achieve a particular point on the rate-distortion curve for one type of message.

Embedded coding, as used herein, may refer to a system of error control for data transmission, whereby the sender adds redundant data to multiple simultaneously transmitted messages. Thus, embedded coding may be channel coding for multiple types of messages. The term "embed" comes from the fact that one or more types of information may be hidden in the codeword of another message. The terms "message" and "information" may be used interchangeably.

Embedded coding, as described herein, solves a different problem than traditional channel coding. Specifically, the problem addressed is the situation where multiple levels of reliabilities (in terms of error probability) are sought for different types of information/messages. In other words, one advantage of embedded coding is the ability to support a variety of applications with different quality-of-service (QoS) requirements. Therefore, providing unequal error protection (UEP) is one of the functions of embedded coding.

For example, different control messages may need different reliability. A channel quality indicator (CQI) and acknowledgment/negative acknowledgement (ACK/NACK) are two types of control signals in a cellular system. Typically, the desired quality for CQI and ACK/NACK are different. In one configuration, the desired quality is a function of a message error rate and delay. Table 1 illustrates an example of desired target qualities for these two types of signals.

TABLE 1

Control Signals Target Quality

| Event | Target Quality |
| --- | --- |
| NACK to ACK error | $10^{-4}$-$10^{-3}$ |
| CQI block error rate | $10^{-2}$-$10^{-1}$ |

As another example, real-time multimedia applications, such as multimedia, may need lower delay and higher reliability as compared to non-real-time applications.

If an overall system is designed for a fixed rate-distortion operating point, the CQI and ACK/NACK may be jointly coded and then multiplexed together as a single type of information. An advantage of this embodiment includes an improvement in performance. However, if jointly coded, the CQI and ACK/NACK may have the same error target quality, which may not be desired. In particular, resources may be over-provisioned, which could otherwise be flexibly allocated to different applications. In other words, channel resources may be wasted by overprotecting one or several of these quantities. Alternatively, one or several of these quantities may not be sufficiently protected if enough channel resources are not used to protect them.

FIG. 1 is a block diagram illustrating a wireless communication system 100 in which embodiments may be practiced. A base station 102 may be in wireless communication with a plurality of user devices 104 (which may also be referred to as user equipment, mobile stations, subscriber units, access terminals, etc.). A first user device 104a, a second user device 104b, and an Nth user device 104n are shown in FIG. 1. The base station 102 may transmit data to the user devices 104 over a radio frequency (RF) communication channel 106.

As used herein, the term "transmitter" refers to any component or device that transmits signals. A transmitter may be implemented in a base station 102 that transmits signals to one or more user devices 104. Alternatively, or in addition, a transmitter may be implemented in a user device 104 that transmits signals to one or more base stations 102.

The term "receiver" refers to any component or device that receives signals. A receiver may be implemented in a user device 104 that receives signals from one or more base stations 102. Alternatively, or in addition, a receiver may be implemented in a base station 102 that receives signals from one or more user devices 104.

The communications system 100 may be an Orthogonal Frequency Division Multiplexing (OFDM) system. In addition, the system 100 may be a Code Division Multiple Access (CDMA) system, a Time Division Multiple Access (TDMA) system, a Frequency Division Multiple Access (FDMA) system, etc.

Figure 2:
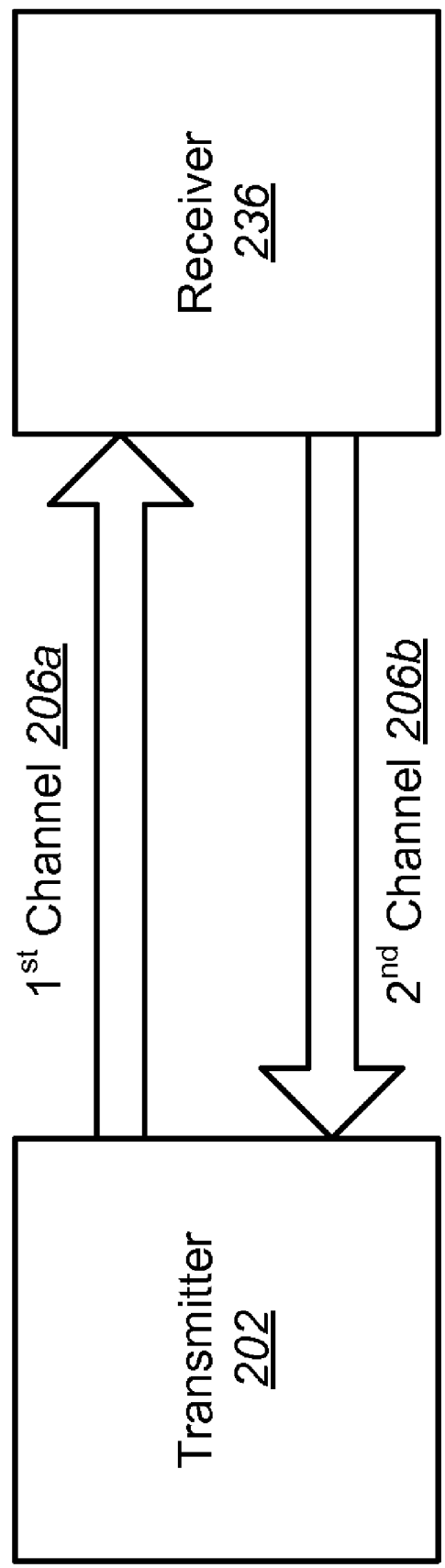
FIG. 2 is a block diagram illustrating communication channels that may exist between a transmitter and a receiver according to an embodiment.

FIG. 2 is a block diagram illustrating communication channels 206 that may exist between a transmitter 202 and a receiver 236 according to an embodiment. As shown, communication from the transmitter 202 to the receiver 236 may occur over a first communication channel 206a. Communication from the receiver 236 to the transmitter 202 may occur over a second communication channel 206b.

The first communication channel 206a and the second communication channel 206b may be separate communication channels 206. For example, there may be no overlap between the transmission band of the first communication channel 206a and the transmission band of the second communication channel 206b. The first communication channel 206a may also be referred to as a downlink, forward link, etc. The second communication channel 206b may be referred to as an uplink, reverse link, etc.

Figure 3:
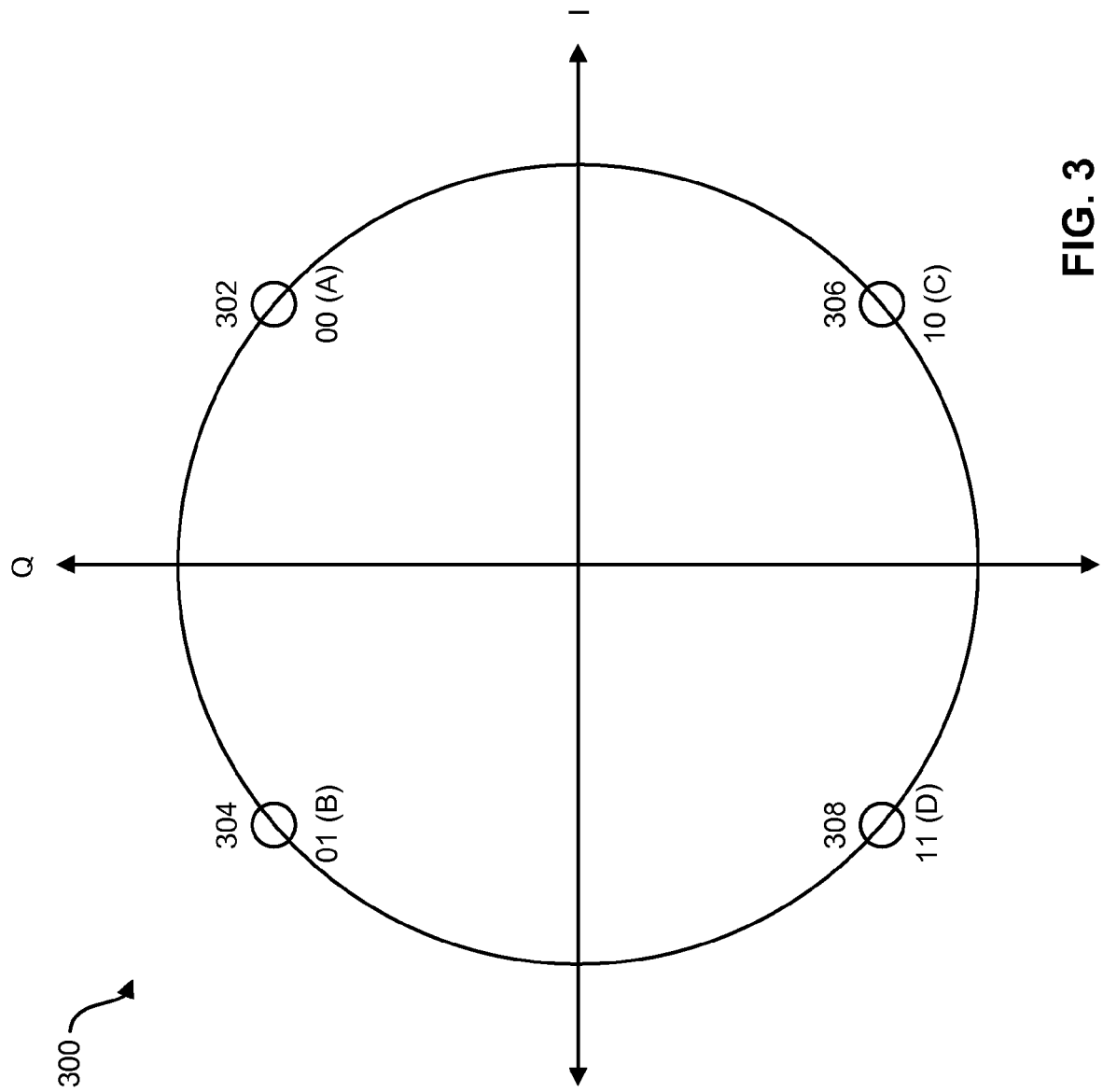
FIG. 3 is one embodiment of a constellation diagram for Quadrature Phase Shift Keying (QPSK) modulation, which may be implemented with the present systems and methods.

FIG. 3 is one embodiment of a constellation diagram 300 for Quadrature Phase Shift Keying (QPSK) modulation, which may be implemented with the present systems and methods. However, other digital modulation schemes may also be used, e.g., 16QAM, 64QAM, etc. QPSK modulation may use four points 302, 304, 306, 308 on the constellation diagram 300, equispaced around a circle. With four points 302, 304, 306 and 308, QPSK modulation may encode two bits of a message into a symbol. For example, a message may include the bits "01". These bits may be encoded as the symbol "B". In a similar manner, the bits "00" may be encoded as the symbol "A", the bits "10" may be encoded as the symbol "C" and the bits "11" may be encoded as the symbol "D".

Figure 4:
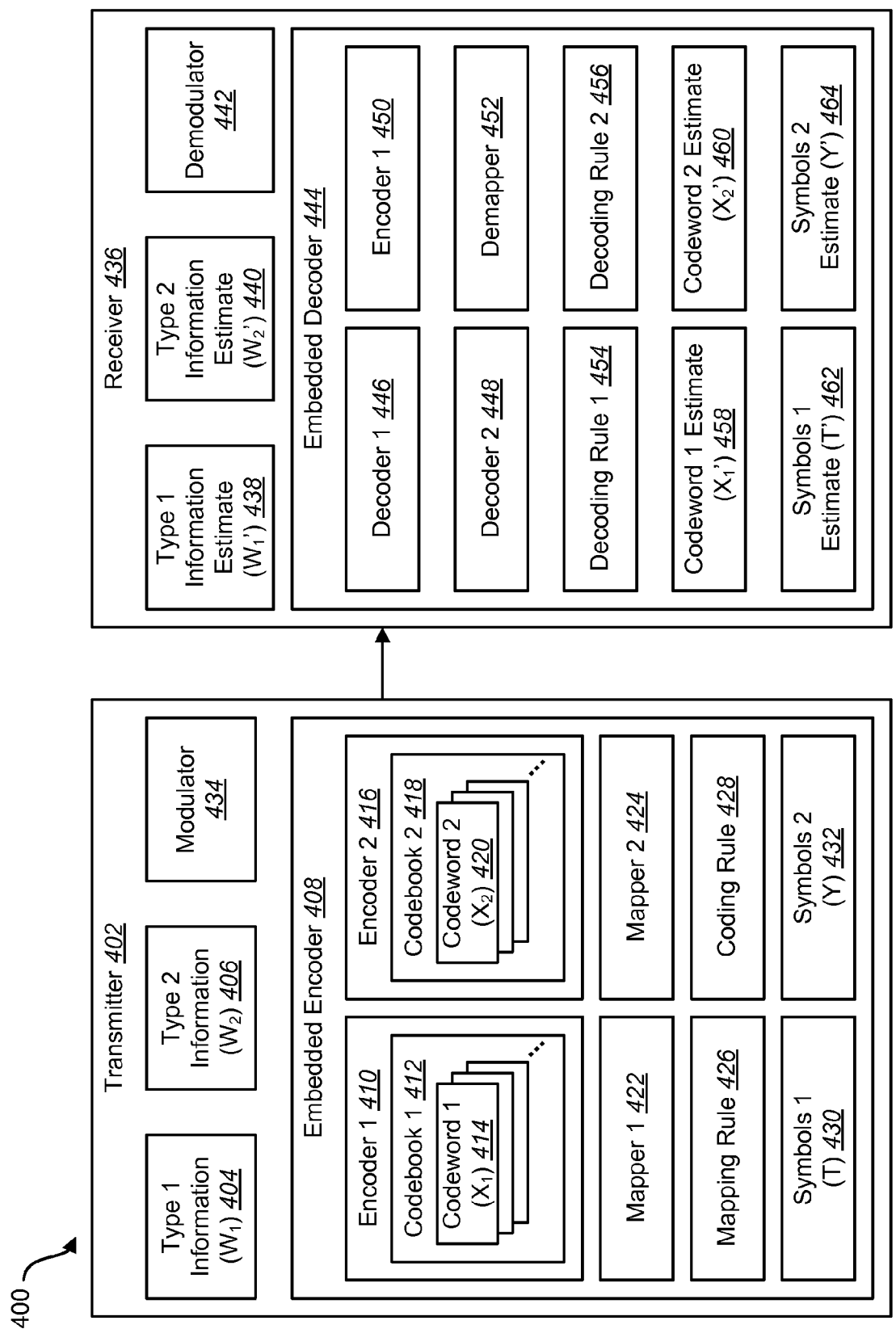
FIG. 4 is a block diagram illustrating a system for providing unequal error protection using embedded coding.

FIG. 4 is a block diagram illustrating a system 400 for providing unequal error protection using embedded coding. The system 400 may have a transmitter 402 and a receiver 436. The transmitter 402 may include type 1 information ($W_1$) 404, type 2 information ($W_2$) 406, an embedded encoder 408, and a modulator 434. Specifically, type 1 information ($W_1$) 404 may have different error protection requirements than type 2 information ($W_2$) 406. However, the type 1 information ($W_1$) 404 may have similar characteristics as the type 2 information ($W_2$) 406, e.g., bit-length, purpose, origin, etc. Alternatively, the type 1 ($W_1$) 404 and type 2 ($W_2$) 406 information may have different characteristics such as bit-length. For the purpose of illustration, the type 1 information ($W_1$) 404 is treated herein as having a higher priority than the type 2 information ($W_2$) 406. However, another configuration may accommodate type 2 information ($W_2$) 406 with higher priority than the type 1 information ($W_1$) 404. The modulator 434 may perform a modulation on the one or more encoded signals. The modulator 434 may produce a plurality of data symbols.

In one example, type 1 information ($W_1$) 404 may be an ACK/NACK signal and type 2 information ($W_2$) 406 may include a CQI signal, or any other signal sent from the transmitter 402 to the receiver 436. In another example, type 1 information ($W_1$) 404 may be a control signal while type 2 information ($W_2$) 406 may be normal user data from the transmitter 402 to the receiver 436.

The embedded encoder 408 may include a first encoder 410, a second encoder 416, a first mapper 422, a second mapper 424, a mapping rule 426, a coding rule 428, a first set of symbols (T) 430 and a second set of symbols (Y) 432. The first encoder 410 may include a first codebook 412. This codebook 412 may be generated from the type 1 information ($W_1$) 404 and may include a plurality of codewords 414. One of the plurality of codewords 414 may encode the type 1 information ($W_1$) 404. Likewise, the second encoder 416 may include a codebook 418 generated from the type 2 information ($W_2$) 406. The codebook 418 may also include a plurality of codewords 420. One of the plurality of codewords 420 may encode the type 2 information ($W_2$) 406. For the purpose of illustration, $X_1$ may be used to denote the codeword 414 used to encode the type 1 information ($W_1$) 404 and $X_2$ may be used to denote the codeword 420 used to encode the type 2 information ($W_2$) 406. $X_1$ 414 and $X_2$ 420 may be digital signals in binary form. The first mapper 422 may be used to map $X_2$ 420 into the first set of symbols (T) 430 based on the mapping rule 426. The second mapper 424 may be used to map $X_1$ 414 into the second set of symbols (Y) 432 based on the coding rule 428 and the first set of symbols (T) 430. The second set of symbols (Y) 432 may be further modulated by the modulator 434 before transmitted to the receiver 436.

The receiver 436 may include an estimate of type 1 information ($W_1'$) 438, an estimate of type 2 information ($W_2'$) 440, a demodulator 442 and an embedded decoder 444. $W_1'$ 438 and $W_2'$ 440 may correspond to the $W_1$ 404 and $W_2$ 406, respectively. In other words, $W_1'$ 438 may be an attempt to reproduce $W_1$ 404, and $W_2'$ 440 may be an attempt to reproduce $W_2$ 406 after decoding and demodulation. The demodulator 442 may demodulate one or more signals transmitted to the receiver 436.

The embedded decoder 444 may include a first decoder 446, a second decoder 448, an encoder 450, a demapper 452, a first 454 and second 456 decoding rule, a first codeword estimate ($X_1'$) 458, a second codeword estimate ($X_2'$) 460, an estimate of a first set of symbols (T') 462, and an estimate of a second set of symbols (Y') 464. The data included in the embedded decoder 444 may be an attempt to reproduce the data in the embedded encoder 408, e.g., $X_1'$, $X_2'$, T', and Y' may be attempts to reproduce $X_1$, $X_2$, T, and Y, respectively.

The first decoder 446 may be used to decode Y' 464 after demodulation. This decoding may utilize the first decoding rule 454 to produce the estimate of type 1 information ($W_1'$) 438. The first decoding rule 454 may be derived from the mapping rule 426 and/or the coding rule 428 and may be expressed in terms of the probability distribution of a combination within $X_1'$ 458 for all possible symbol combinations within a portion of Y' 464. This will be explained in more detail below. The encoder 450 may be used to derive the estimate of $X_1$ ($X_1'$) 458 from the estimate of type 1 information ($W_1'$) 438. This encoder 450 may be similar to the first encoder 410 on the transmitter 402. The demapper 452 may decode Y' 464 using the second decoding rule 456 to produce an estimate of the second codeword estimate ($X_2'$) 460. The second decoding rule 456 may also be derived from the mapping rule 426 and/or the coding rule 428. The second codeword estimate ($X_2'$) 460 may then be decoded using the second decoder 448 to produce the estimate of type 2 information ($W_2'$) 440. The second decoder 448 may be designed as the counterpart to the second encoder 416 on the transmitter 402. In other words, the second decoder 448 may be designed to decode the encoding performed by the second encoder 416.

In the illustrated system 400, the receiver 436 may be able to accurately reproduce an estimate of the information sent by the transmitter 402 while providing unequal error protection to the two types of information, thus efficiently using the system resources. The system 400 and methods will be described in further detail below.

Figure 5:
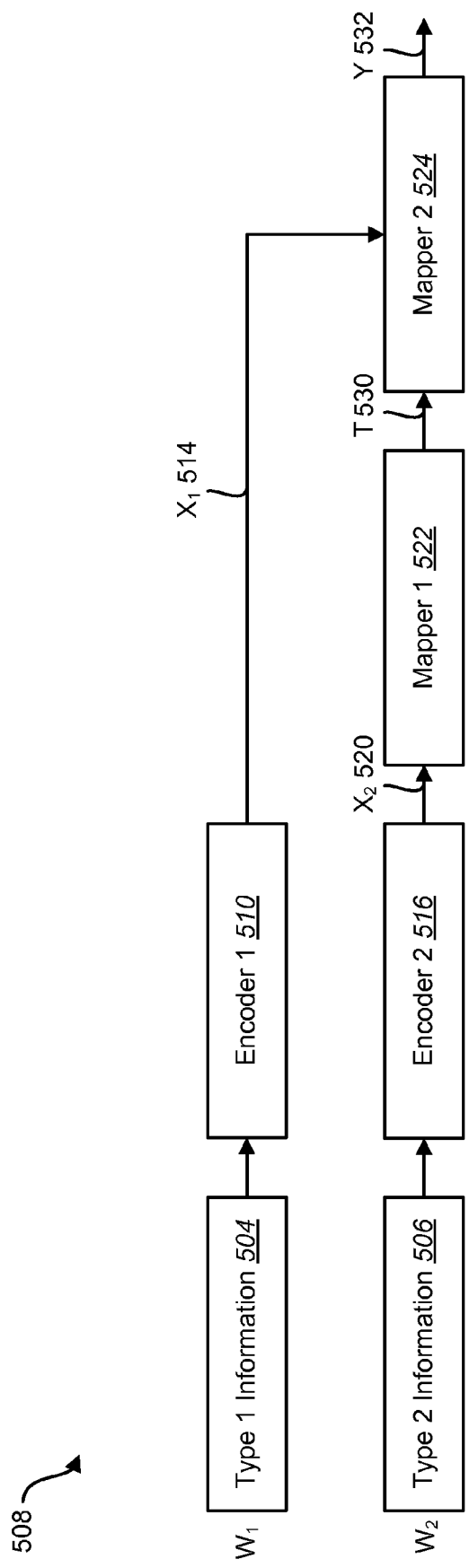
FIG. 5 is a block diagram of an embedded encoder for embedded encoding of two types of information.

FIG. 5 is a block diagram of an embedded encoder 508 for embedded encoding of two types of information. Embedded coding may be described as the selection of a final codeword (Y) 532 based on the codeword of Type 1 information ($X_1$) 514 and the codeword of Type 2 information ($X_2$) 520. In other words, the final output codeword (Y) 532 may implicitly convey both Type 1 information ($W_1$) 504 and Type 2 information ($W_2$) 506.

For the purpose of illustration, and without limitation, assume $W_1$ 504 and $W_2$ 506 are $k_1$ and $k_2$ bits long, respectively, and $X_1$ 514 and $X_2$ 520 are $n_1$ and $n_2$ bits long, respectively. Thus, the rates, $r_1$ and $r_2$, of the first encoder 510 and second encoder 516 may be $r_1=k_1/n_1$ and $r_2=k_2/n_2$ respectively. Also, assume $W_1$ 504 has higher priority than $W_2$ 506. Note that the first encoder 510 and the second encoder 516 may utilize any error-correcting code with coding rates of $r_1$ and $r_2$, respectively. In one example, the first encoder 510 may be a convolutional encoder, and the second encoder 516 may be a Turbo encoder. However, other error-correcting codes, such as Low-Density Parity Check (LDPC) code or Reed-Solomon (RS) code, may be used here as well. In another example, the first encoder 510 may be a Turbo code encoder, and the second encoder 516 may be a LDPC encoder. The types of the first encoder 510 and the second encoder 516 may be chosen based on a desired performance target and other constrains such as implementation limitation, etc. Embedded encoding, or the process of choosing Y 532, will now be described with reference to FIG. 5.

First, using available values, the embedded encoder 508 may determine the rates of the first encoder 510 and second encoder 516. Assume here, that h denotes the size of Y 532 in number of bits. Note that h may be determined outside the embedded encoder 508. Also assume here, that q denotes the number of bits carried by each modulation symbol. Assuming QPSK modulation, then q=2. Note that q may be determined outside the embedded encoder 508. Additionally, $X_1$ 514 may be split into strings of size $m_1$ bit(s) and $X_2$ 520 may be split into strings of size $m_2$ bit(s), resulting in $n_1/m_1$ and $n_2/m_2$ strings, respectively. Using these values, the following definitional equations (1), (2) may be used:

$$h/q = p_1 \times n_1/m_1 \quad (1)$$

$$h/q = p_2 \times n_2/m_2 \quad (2)$$

where $p_1$, $p_2$, $m_1$ and $m_2$ are all positive integers, and may be chosen to produce a desired performance. Given h, $p_1$, $p_2$, $m_1$, $m_2$, $k_1$, and $k_2$, the embedded encoder 508 may then determine $n_1$, $n_2$, $r_1$ and $r_2$ using the following equations (3), (4), (5), (6):

$$n_1 = hm_1/qp_1 \quad (3)$$

$$n_2 = hm_2/qp_2 \quad (4)$$

$$r_1 = k_1/n_1 \quad (5)$$

$$r_2 = k_2/n_2 \quad (6)$$

In one example, that will be repeatedly revisited below, h=288, q=2, $k_1$=8, and $k_2$=132. Furthermore, if $m_1$=2, $m_2$=3, $p_1$=2 and $p_2$=2 are chosen, then the following values may result: $n_1$=144, $n_2$=216, $r_1$=1/18, and $r_2$=11/18.

The value $p_1$ may define the number of symbols in the second set of symbols (Y) 432, which carry the information for each $X_1$ string of size $m_1$ bit(s). Likewise, the value $p_2$ may define the number of symbols in the first set of symbols (T) 430, which carry the information for each $X_2$ string of size $m_2$ bit(s). In the above example, every 2 (since $p_2$=2) QPSK symbols in the first set of symbols (T) 530 may carry the information contained in a 3 ($m_2$=3) bits $X_2$ string and every 2 (since $p_1$=2) QPSK symbols in the second set of symbols (Y) 532 may carry the information contained in a 2 ($m_1$=2) bits $X_1$ string. Note that $p_1$, $p_2$, $m_1$ and $m_2$ may be different values. The values of $p_1$, $p_2$, $m_1$ and $m_2$ may be chosen based on a desired performance target and other constrains such as complexity limit. Thus $n_1$, $n_2$, $r_1$ and $r_2$ may change accordingly.

Second, following the rate determination, the embedded encoder 508 may generate the codewords $X_1$ 514 and $X_2$ 520 through two conventional encoders 510, 516 at the rates determined above. In the above example, the first encoder 510 may be a rate 1/18 convolutional encoder (using $r_1$=1/18) and the second encoder 516 may be a rate 11/18 Turbo encoder (using $r_2$=11/18). These coding rates may be achieved by repeating or puncturing bits in the intermediate codewords to get the final codewords, $X_1$ 514 and $X_2$ 520. Additionally, other techniques such as complex rate matching algorithms may be used to reach these coding rates. Also, as mentioned previously, other error-correcting codes, such as LDPC, or RS code may be used here as well.

Third, after generating $X_1$ 514 and $X_2$ 520, the embedded encoder 508 may map $X_2$ 520 into a first set of symbols (T) 530. First, $X_2$ 520 may be grouped into binary strings of length $m_2$. Then, a first mapper 522 may map, or encode, each string of $m_2$ bits into $p_2$ symbol(s) based on a mapping rule 426. This may result in $n_2/m_2$ (which is equal to $h/qp_2$) strings that may map into h/q symbols (T) 530. Note that the order of $X_2$ 520 may be kept even when $X_2$ 520 is grouped into strings and mapped into symbols (T) 530. The terms "map" and "encode" may refer to any modification of data and may be used interchangeably herein.

Following the above example, where $m_2$=3 and $p_2$=2, Table 2 shows a possible mapping rule 426. Since $m_2$=3, there may be 8 ($2^3$=8) possible combination of bits in each $X_2$ string. Furthermore, since $p_2$=2, each $X_2$ string combination may be mapped into 2 consecutive QPSK symbols. Note that this table is merely an example and that many different rules may easily be derived. Note also that any correlation of the bits in the $X_2$ string and of QPSK symbols may be used as long as a given combination of bits in the $X_2$ string maps to at most one set of $p_2$ QPSK symbols (e.g., "000" maps to "DA" for the example rule below).

TABLE 2

Example mapping of $X_2$ string

| Combination of bits in the $X_2$ string | Mapped QPSK symbols |
|---|---|
| 000 | DA |
| 001 | CA |
| 010 | BC |
| 011 | BA |
| 100 | AD |
| 101 | AB |
| 110 | AC |
| 111 | AA |

Lastly, a second mapper 524 may determine Y 532 from T 530, $X_1$ 514, and a coding rule 428. The codeword $X_1$ 514 may first be grouped into binary strings of length $m_1$, similar to the steps taken for $X_2$ 520 above. This may result in $n_1/m_1$ (which is equal to $h/qp_1$) strings used to control T 530. Additionally, the output of the step above, T 530, may be grouped into $h/qp_1$ symbols, with each group including $p_1$ symbol(s). Then, each $X_1$ string ($m_1$ bits) may be used to map $p_1$ symbol(s) of T 530 to $p_1$ symbol(s) of Y 532 based on the coding rule 428.

Following the above example, where $m_1$=2 and $p_1$=2, Table 3 shows a possible coding rule 428. Since $m_1$=2, there may be 4 ($2^2$=4) possible combination of bits in each $X_1$ string. Furthermore, since $p_1$=2 each combination may be used to control 2 consecutive QPSK symbols of T 530. Note that this table is merely an example and that many different rules may easily be derived.

TABLE 3

Example coding rule of $X_1$ string onto T symbols

| Combination of bits in the $X_1$ string | Rule |
|---|---|
| 00 | Counter-clockwise rotate 0 degree |
| 01 | Counter-clockwise rotate 90 degrees |
| 11 | Counter-clockwise rotate 180 degrees |
| 10 | Counter-clockwise rotate 270 degrees |

The following example illustrates the coding rule 428 when two QPSK symbols in T 530 are "BA," although it is appreciated that the coding rule 428 applies to any combination possible on the constellation diagram 300. When the $X_1$ string is "00," the two corresponding symbols in the final output (Y) 532 may be "BA" which is the same as those of T 530, since there may be no rotation for a combination of "00" in $X_1$ according to the example coding rule 428. In other words, the symbols in Y 532 will be the same as T 530 for this $X_1$ string according to the coding rule 428. On the other hand, if the $X_1$ string is "01," the two corresponding symbols in the final output, Y 532, may be "DB" because there may be a rotation of 90 degrees counter-clockwise around the constellation diagram 300 in FIG. 3 for a combination of "01." Thus, the "B" may become a "D" and the "A" may become a "B." Likewise, if the $X_1$ string is "10", the two corresponding symbols in the final output, Y 532, may be "AC". And, if the $X_1$ string is "11", the two corresponding symbols in the final output, Y 532, may be "CD."

Note that in this above example, each two symbols of Y 532 may not be unique. In other words, two different combinations of $X_1$ and $X_2$ strings may produce the same output. For example, a combination of "10" in $X_1$ 514 and "011" in $X_2$ 520 will output "AC" just as a combination of "00" in $X_1$ 514 and "110" in $X_2$ 520.

Figure 6:
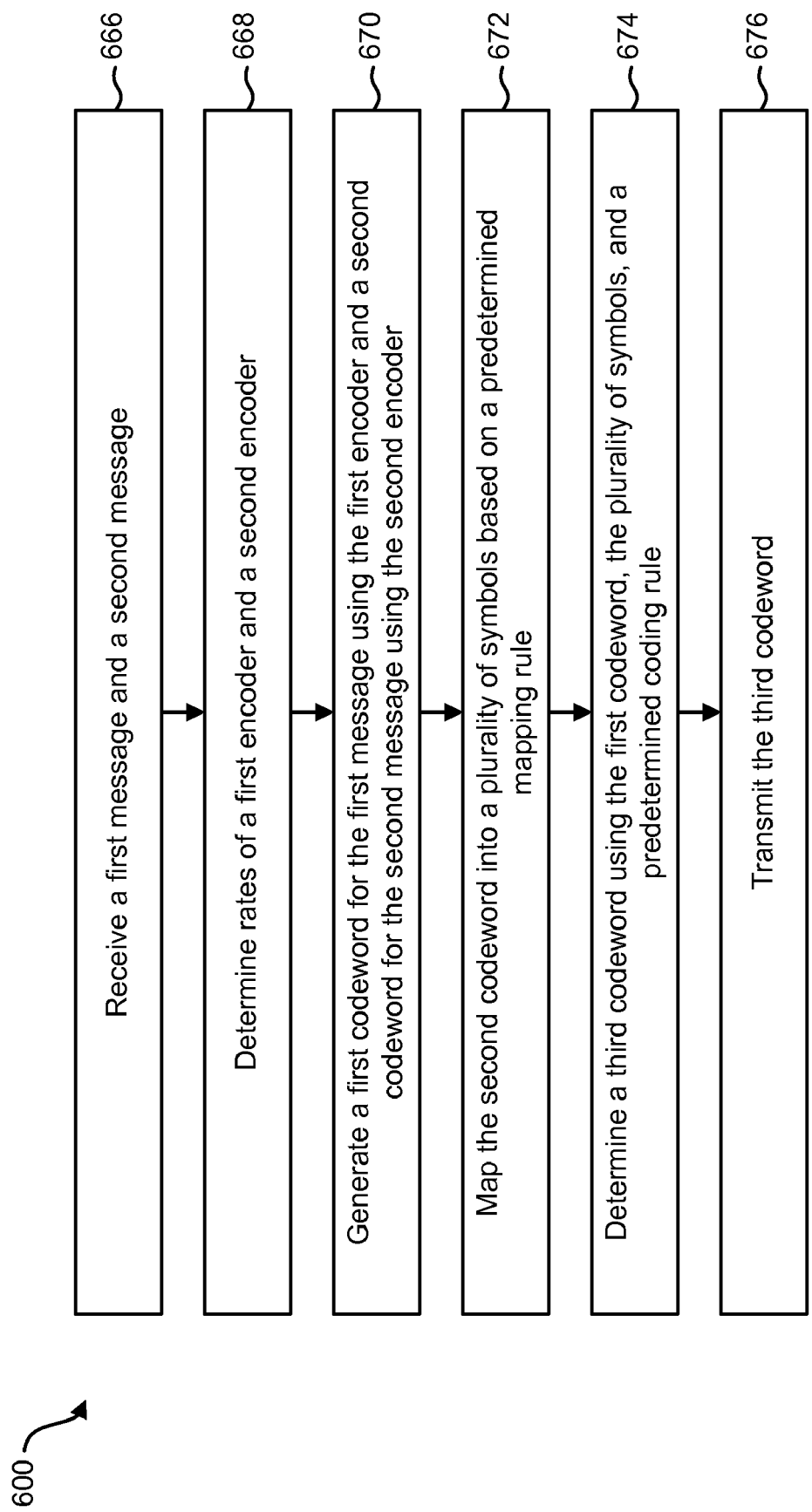
FIG. 6 is a flow diagram illustrating a method of embedded encoding of two types of information.

FIG. 6 is a flow diagram illustrating a method 600 of embedded encoding of two types of information. First, an embedded encoder 408 may receive 666 a first message and a second message 406. The first message may be type 1 information ($W_1$) 404 and the second message may be type 2 information ($W_2$) 406. These two messages may have unequal error protection requirements. The embedded encoder 408 may then determine 668 the rates of a first encoder 410 and a second encoder 416. This determining may be done using a plurality of values representing the bit-length of type 1 ($W_1$) 404 and type 2 ($W_2$) 406 information, the bit-length of a desired first codeword ($X_1$) 414 and second codeword ($X_2$) 420, a desired third codeword (Y) 432, etc. The embedded encoder may then generate 670 a first codeword ($X_1$) for the first message ($W_1$) 404 using the first encoder 410 and a second codeword ($X_2$) 420 for the second message ($W_2$) 406 using the second encoder 416. The first encoder 410 may be a convolutional encoder and the second encoder 416 may be a Turbo encoder, although other error correcting codes, such as LDPC or RS code may also be used.

The second codeword ($X_2$) 420 may then be mapped 672 into a plurality of symbols (T) 430 based on a predetermined mapping rule 426. This may include grouping the second codeword into a series of strings and then mapping each string into one or more QPSK symbols (T) 430 using a mapping rule 426. Alternatively, other modulation schemes such as 16QAM, 64QAM, etc. may also be used. A third codeword (Y) 432 may then be determined 674 using the first codeword ($X_1$) 414, the plurality of symbols (T) 430, and a predetermined coding rule 428. This determining 674 may include grouping the first codeword ($X_1$) 414 into a series of strings and then, based on those strings, modifying the plurality of symbols (T) 430 according to the coding rule 428. This third codeword (Y) 432 may also be a plurality of QPSK symbols. The third codeword (Y) 432 may then be transmitted 676.

Figure 7:
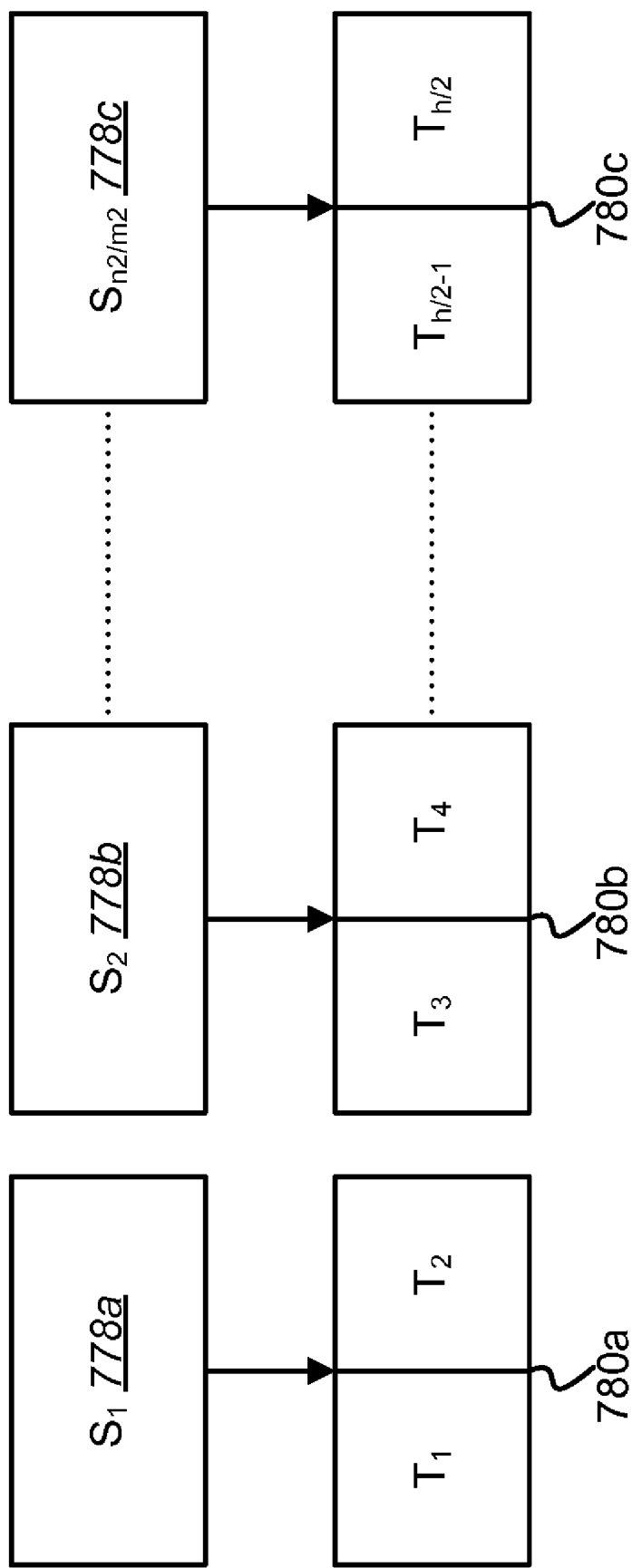
FIG. 7 is a block diagram illustrating a series of strings being mapped into a series of QPSK symbols using a mapping rule.

FIG. 7 is a block diagram illustrating a series of strings 778 being mapped into a series of QPSK symbols using a mapping rule 426. This mapping may correspond to step 672 in FIG. 6. Initially, a codeword, such as $X_2$ 420, may be grouped into a series of strings 778. Each string 778 may be $m_2$ bits. And, following the same example above, since $X_2$ 420 may be $n_2$ bits long, this grouping may result in $n_2/m_2$ (which is equal to $h/qp_2$) strings 778. Then, each string 778 may be mapped into $p_2$ (which is equal to h/q) QPSK symbols 780 using a predetermined mapping rule 426. Combined together, these symbols 780 may be T 430, which may then be coded into Y 432 to be transmitted to a receiver 436. Note that each string 778 is then mapped into $p_2$ QPSK symbols 780. So, for the example of $p_2$=2 shown, each string 778 is mapped into 2 QPSK symbols 780. However, if $p_2$ were chosen to be 1, then each string 778 may be mapped into 1 QPSK symbol. Also, note that even though $X_2$ 420 is first grouped into a series of strings 778 and then mapped into a series of QPSK symbols 780, the order of $X_2$ 420 is maintained throughout.

Figure 8:
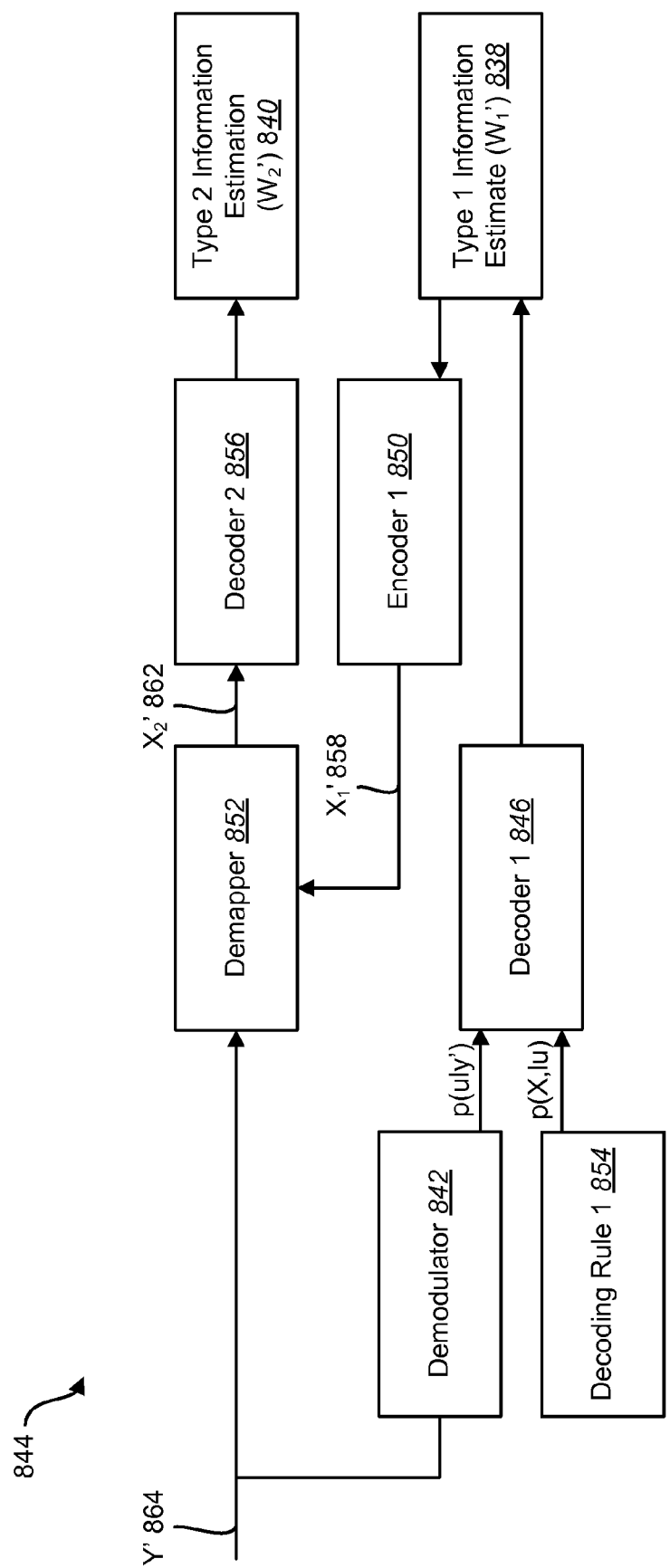
FIG. 8 is a block diagram of an embedded decoder for embedded decoding of a signal conveying two types of information.

FIG. 8 is a block diagram of an embedded decoder 844 for embedded decoding of a signal conveying two types of information. Embedded decoding may be described as the deriving of an estimate of type 1 information ($W_1'$) 838 and type 2 information ($W_2'$) 840 from a received estimate of symbols (Y') 864. In other words, embedded decoding may be an attempt to estimate $W_1$ 404 and $W_2$ 406 residing on a transmitter 402 from a codeword Y' 864 received by a receiver 436

First, an embedded decoder 844 may determine a first decoding rule 854 for a type 1 codeword $X_1$ 414. The first decoding rule 854 may be derived from a combination of steps performed in the embedded encoder 508 described above. This decoding rule 854 may be expressed in terms of the probability distribution of an $X_1$ string for the symbols in Y' 864.

For the purpose of illustration, and without limitation, the same values will be used to describe the embedded decoder 844 as were used to describe the embedded encoder 508 (h=288, q=2, $k_1$=8, $k_2$=132, $m_1$=2, $m_2$=3, $p_1$=2, $p_2$=2, $n_1$=144 and $n_2$=216). For two ($p_1$=2) QPSK symbols in Y' 864, there may be 16 possible combinations ($4^2$=16). Considering Table 2 and Table 3 above, however, there may be 32 $X_1$ string and $X_2$ symbol possible combinations (8 possible $X_2$ symbol combinations from Table 2 multiplied by 4 possible $X_1$ string combinations from Table 3). Thus, the following Table 4 may be derived from Table 2 and Table 3 above. The value of "⅛" in this table comes from the assumption that the $X_2$ string is uniformly distributed as shown in Table 2. In other words, for a given combination of two Y' 864 QPSK symbols and $X_1$ string combinations in Table 3, there may be eight possible $X_2$ symbol combinations in Table 2 equally likely to produce that combination of QPSK symbols in Y' 864. The following equations (7), (8), (9), (10) may be used to derive Table 4:

$$\sum_{u \in Y} p(X_1 = \text{"00"} | u) p(u) = 1 \quad (7)$$

$$\sum_{u \in Y} p(X_1 = \text{"01"} | u) p(u) = 1 \quad (8)$$

$$\sum_{u \in Y} p(X_1 = \text{"11"} | u) p(u) = 1 \quad (9)$$

$$\sum_{u \in Y} p(X_1 = \text{"10"} | u) p(u) = 1 \quad (10)$$

The variable u represents the possible $p_1$-symbol pair found in Y' 864. Note that this decoding rule 854 may be pre-determined, and therefore be stored in the receiver 436 once encoding rules 426, 428 are decided in the embedded encoder 508.

TABLE 4

Example decoding rule of Y' symbols onto $X_1$

| QPSK symbols | $p(X_1 = $ "00"$\|u)$ | $p(X_1 = $ "01"$\|u)$ | $p(X_1 = $ "11"$\|u)$ | $p(X_1 = $ "10"$\|u)$ |
|---|---|---|---|---|
| AA | 1/8 | 0 | 0 | 0 |
| AB | 1/8 | 1/8 | 0 | 0 |
| AC | 1/8 | 0 | 1/8 | 0 |
| AD | 1/8 | 0 | 1/8 | 1/8 |
| BA | 1/8 | 1/8 | 0 | 0 |
| BB | 0 | 1/8 | 0 | 0 |
| BC | 1/8 | 1/8 | 1/8 | 0 |
| BD | 0 | 1/8 | 0 | 1/8 |
| CA | 1/8 | 0 | 1/8 | 0 |
| CB | 0 | 1/8 | 1/8 | 1/8 |
| CC | 0 | 0 | 1/8 | 0 |
| CD | 0 | 0 | 1/8 | 1/8 |
| DA | 1/8 | 1/8 | 0 | 1/8 |
| DB | 0 | 1/8 | 0 | 1/8 |
| DC | 0 | 0 | 1/8 | 1/8 |
| DD | 0 | 0 | 0 | 1/8 |

Second, once the decoding rule 854 has been determined, Y' 864 may be demodulated. As noted earlier, Y' 864 may include h/q received QPSK symbols. The demodulator 842 used may be a conventional demodulator 842. Also recall that Y' 864 may be mapped into a series of $p_1$-symbol pairs, denoted by y', in the embedded encoder 508. So, demodulation may include calculating the probability of a specific $p_1$-symbol pair being transmitted. In this way, the demodulator 842 may produce a soft output, or one denoting a value and a probability that the value is correct.

Following the prior example, the embedded decoder 844 may calculate the probabilities p(u|y') where u belongs to the set of {AA, AB, AC, AD, BA, BB, BC, BD, CA, CB, CC, CD, DA, DB, DC, DD} which is the set of all possible combinations with 2 QPSK symbols transmitted. Any method known in the art may be used to calculate these probabilities. For example, log-likelihood ratio (LLR) algorithm may be used to calculate p(u="AA"|y'), p(u="AB"|y'), p(u="AC"|y'), etc. Recall that in this example, Y' 864 includes 144 (h/q) QPSK symbols and has been divided into groups of 2 ($p_1$=2) symbols. Thus, there may be 72 (h/$qp_1$) pairs of QPSK symbols, y', in Y' 864. Further, each of these 16 probabilities may be calculated for each y'. For example, there may be 1152 probabilities calculated by the demodulator 842, 16 probabilities for each of the 72 pairs, y', in Y' 864.

Third, the embedded decoder 844 may decode an estimate of type 1 information ($W_1$') 838. This may include using the first decoder 846. The value $p(X_1|y')$ may be calculated using the $p(X_1|u)$ values in the decoding rule 854 and the p(u|y') values produced by the demodulator 842. Thus for each possible value of $X_1$ 858, $p(X_1|y')$ may be calculated using Bayes' theorem as shown in equation (11):

$$p(X_1 = i \mid y') = \sum_{u \in U} p(X_1 = i \mid u) p(u \mid y') \quad (11)$$

In equation (11) U is the set of all possible combinations for a $p_1$-symbol pair, y', and i is the element of the set of all possible values taken by an $m_1$-length binary strings. In the continuing example, since $m_1$=2, there may be four ($2^2$=4) possible values for i, "00," "01," "10," "11." Then, a first decoder 846 corresponding to the first encoder 410 may be used to decode the codeword of Y' 864. In other words, the first decoder 846 may take the $p(X_1|y')$ values and using the decoding rule 854, produce an estimate of type 1 information ($W_1$') 838. Note that soft input may be used for this decoder 846 of Type-1 strings and the output of this step may be an estimate of type 1 information ($W_1$') 838 that is $k_1$ bits long.

Still using the example, this decoding is now illustrated. Initially, four probabilities $p(X_1$="00"$|y')$, $p(X_1$="01"$|y')$, $p(X_1$="11"$|y')$ and $p(X_1$="10"$|y')$ may be calculated for each pair of QPSK symbols, y'. There may be 72 total pairs, y', in Y' 864. Those values may then be inputted for each pair of QPSK symbols, y', into the first decoder 846. The first decoder 846 may be a convolutional decoder using some standard convolutional decoding method such as Viterbi decoding. The output of the first decoder 846 may be the estimate of type 1 information, ($W_1$') 838, that is 8 ($k_1$=8) bits long.

Lastly, the embedded decoder 844 may decode an estimate of type 2 information 840. An estimate of a first codeword ($X_1$') 858 may be generated by an encoder 850 from the estimate of type 1 information ($W_1$') 838. The encoder 850 may use coding identical to the first encoder 410 on the transmitter 402.

Next, the demapper 852 may demap Y' 864 using a second decoding rule 456. The codeword $X_1$' 858 may be grouped into binary strings of length $m_1$. Then, the received symbols Y' 864 may also be grouped into h/$qp_1$ symbol groups, and each group may include $p_1$ symbol(s). For each $X_1$' string ($m_1$ bits long), the second decoding rule 456 may be used to control $p_1$ symbol(s), y', of Y' 864. The second decoding rule 456 may be derived from the mapping rule 426 and/or the coding rule 428. For example, where $m_1$=2 and $p_1$=2, as in the continuing example, Tables 5 and 6 show a possible second decoding rule 456. The rule 456 may be the inverse rule in Tables 3 and 2, respectively. The received symbols Y' 864 may be controlled based on Table 5 and $X_1$' 858 to get the intermediate results that may correspond to T 430, denoted herein by T'. Then these intermediate results T' may be further decoded based on the decoding rule such as in Table 6. The final output of the demapper 852 may correspond to $X_2$ 420 and is denoted herein by $X_2$' 862.

TABLE 5

Example decoding rule of $X_1$' string onto T' symbols

| Combination of bits in the string of $X_1$' | Rule |
|---|---|
| 00 | Clockwise rotate 0 degree |
| 01 | Clockwise rotate 90 degrees |
| 11 | Clockwise rotate 180 degrees |
| 10 | Clockwise rotate 270 degrees |

TABLE 6

Example decoding rule of T' string

| Most likely to be mapped QPSK symbols in T' | Combination of bits in the $X_2$' string |
|---|---|
| DA | 000 |
| CA | 001 |
| BC | 010 |
| BA | 011 |
| AD | 100 |
| AB | 101 |
| AC | 110 |
| AA | 111 |

Finally, $X_2'$ 862 may go through a second decoder 856, which may be a standard decoder corresponding to the second encoder 416 on the transmitter 402. This may produce an estimate of type 2 information ($W_2'$) 840.

Figure 9:
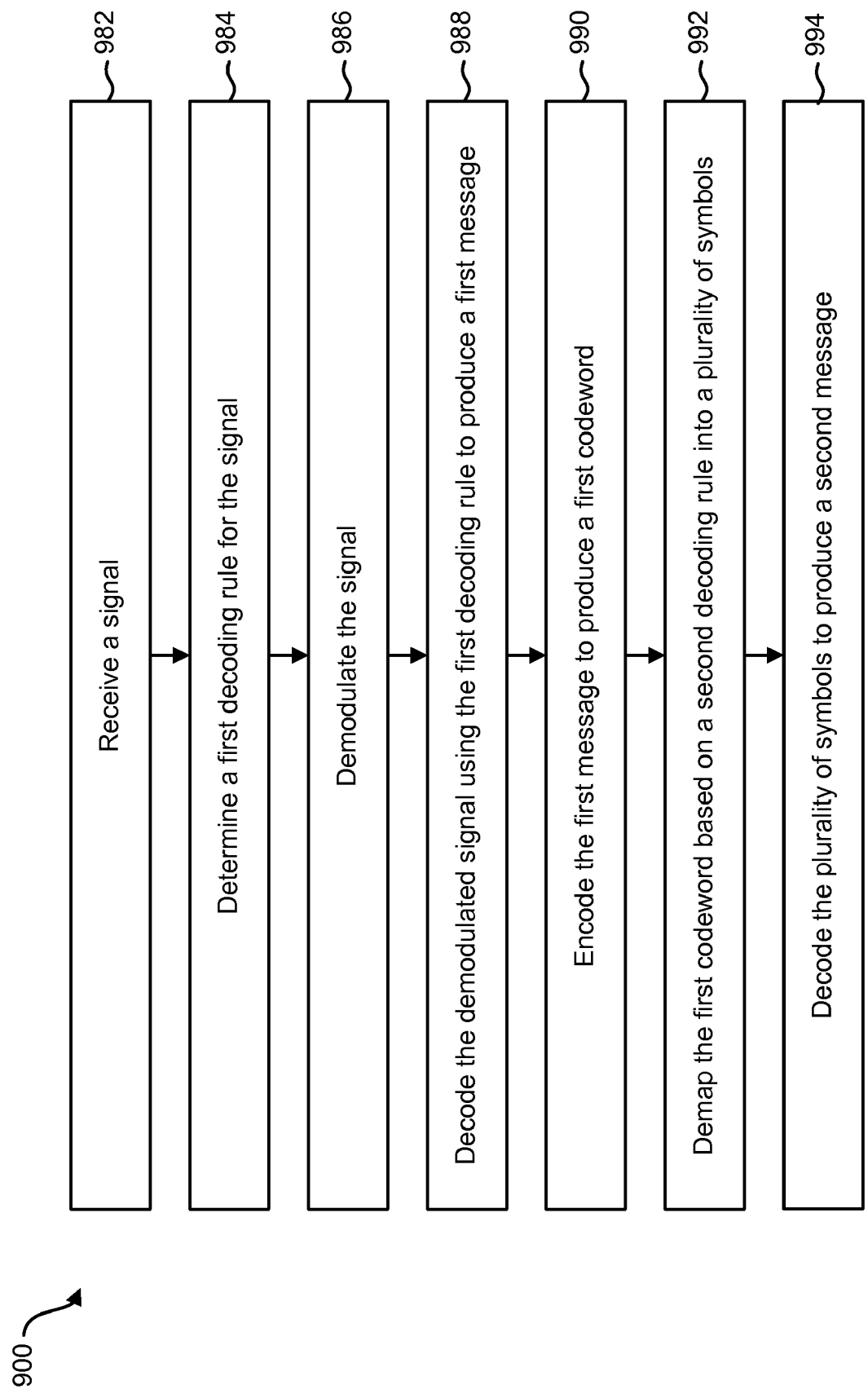
FIG. 9 is a flow diagram illustrating a method of embedded decoding.

FIG. 9 is a flow diagram illustrating a method 900 of embedded decoding. First, an embedded decoder 444 may receive 982 a signal. The signal may be $Y'$ 864 and may include information relating to type 1 information ($W_1$) 404 and type 2 information ($W_2$) 406, each with different error protection requirements. The embedded decoder 444 may then determine 984 a first decoding rule 454 for the signal $Y'$ 864. This determining 984 may be expressed in terms of the probability distribution of an $X_1$ string for a set of symbols in the signal, $Y'$ 864. The embedded decoder 444 may then demodulate 986 the signal. This may include calculating a series of probabilities for each set of symbols within $Y'$ 864. The demodulated signal may then be decoded 988 using the first decoding rule 454 to produce a first message. This first message may be an estimate of type 1 information ($W_1'$) 838. The embedded decoder 444 may then encode 990 the first message ($W_1'$) 838 to produce a first codeword ($X_1'$) 858. This encoding may be identical or similar to the encoding performed by the first encoder 410 in the transmitter 402. The signal $Y'$ 864 may then be demapped 992, based on the first codeword ($X_1'$) 858 and a second decoding rule 456, into a second codeword ($X_2'$) 862. The second codeword ($X_2'$) 862 may then be decoded 994 to produce a second message ($W_2'$) 840. This decoding 994 may be performed by the second decoder 856, which may correspond to the second encoder 416 on the transmitter 402. The second message may be an estimate of type 2 information ($W_2'$) 840.

Figure 10:
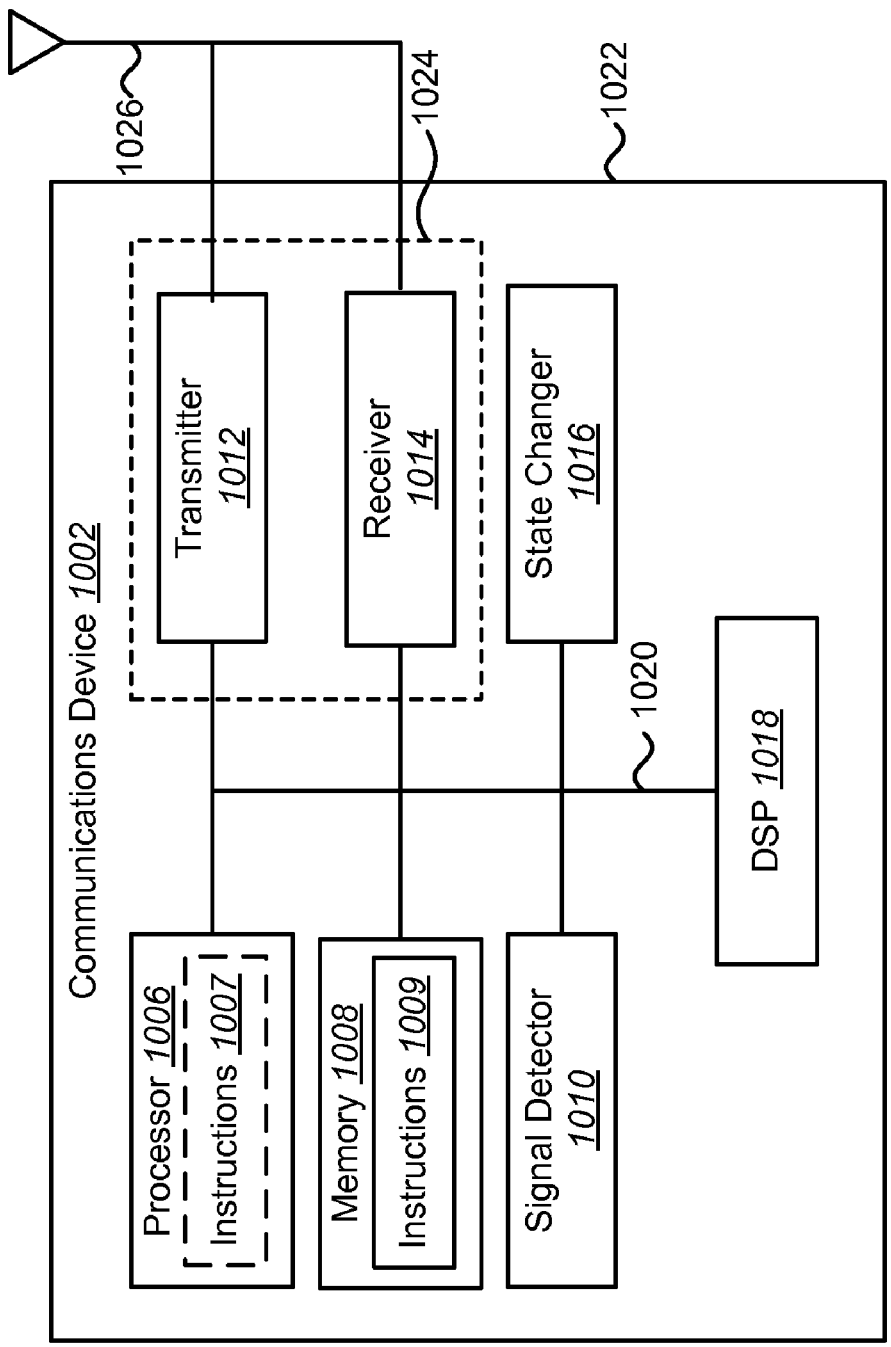
FIG. 10 illustrates various components that may be utilized in a communications device.

FIG. 10 illustrates various components that may be utilized in a communications device 1002. The communications device 1002 may include any type of communications device such as a mobile station, a cell phone, an access terminal, user equipment, a base station transceiver, a base station controller, etc. The communications device 1002 includes a processor 1006 which controls operation of the communications device 1002. The processor 1006 may also be referred to as a CPU. Memory 1008, which may include both read-only memory (ROM), random access memory (RAM) or any type of device that may store information, provides instructions 1009 and data to the processor 1006. A portion of the memory 1008 may also include non-volatile random access memory (NVRAM). Alternatively, or in addition to, instructions 1007 may reside in the processor 1006. Instructions 1007 loaded onto the processor 1006 may also include instructions 1009 from memory 1008 that were loaded for execution by the processor 1006.

The communications device 1002 may also include a housing 1022 that contains a transmitter 1012 and a receiver 1014 to allow transmission and reception of data. The transmitter 1012 and receiver 1014 may be combined into a transceiver 1024. An antenna 1026 is attached to the housing 1022 and electrically coupled to the transceiver 1024. Additional antennas (not shown) may also be used.

The communications device 1002 may also include a signal detector 1010 used to detect and quantify the level of signals received by the transceiver 1024. The signal detector 1010 detects such signals as total energy, pilot energy, power spectral density, and other signals.

A state changer 1016 controls the state of the communications device 1002 based on a current state and additional signals received by the transceiver 1024 and detected by the signal detector 1010. The communications device 1002 may be capable of operating in any one of a number of states.

The various components of the communications device 1002 are coupled together by a bus system 1020 which may include a power bus, a control signal bus, and a status signal bus in addition to a data bus. However, for the sake of clarity, the various buses are illustrated in FIG. 10 as the bus system 1020. The communications device 1002 may also include a digital signal processor (DSP) 1018 for use in processing signals. The communications device 1002 illustrated in FIG. 10 is a functional block diagram rather than a listing of specific components.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory may be integral to a processor and still be said to be in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for embedded encoding of at least two types of information, the method comprising:
   determining the types of a first encoder and a second encoder;
   determining the rates of the first encoder and the second encoder;
   generating a first codeword and a second codeword;
   determining a mapping rule for the second codeword and a coding rule for the first codeword;
   mapping the second codeword into a plurality of symbols using the mapping rule;
   determining a third codeword using the first codeword, the plurality of symbols, and the coding rule, wherein the coding rule defines a rotation around a constellation for the plurality of mapped symbols based on the first codeword; and
   transmitting the third codeword, wherein the third codeword includes at least two types of information that require unequal error protection.

2. The method of claim 1, wherein the constellation is a Quadrature Phase Shift Keying (QPSK) constellation.

3. The method of claim 1, wherein the generating comprises encoding a first message with the first encoder and encoding a second message with the second encoder.

4. The method of claim 1, wherein the first encoder is an error-correcting code encoder and the second encoder is an error-correcting code encoder.

5. The method of claim 4, wherein the first encoder is a convolutional encoder.

6. The method of claim 4, wherein the second encoder is a Turbo encoder.

7. The method of claim 1, wherein the symbols are Quadrature Phase Shift Keying (QPSK) symbols.

8. A method for embedded decoding of a signal conveying at least two messages, the method comprising:
   receiving a signal;
   determining a first decoding rule for the signal;
   demodulating the signal;
   decoding the demodulated signal using the first decoding rule to produce a first message;
   encoding the first message to produce a first codeword;
   demapping the demodulated signal using the first codeword and a second decoding rule to produce a second codeword, wherein the second decoding rule defines a rotation around a constellation for the demodulated signal values based on the first codeword; and
   decoding the second codeword to produce a second message, wherein the first message and second message require unequal error protection.

9. The method of claim 8, wherein constellation is a Quadrature Phase Shift Keying (QPSK) constellation, wherein the second decoding rule further comprises instructions for mapping the rotated signal values to produce the second codeword.

10. The method of claim 8, wherein the first decoding rule is a probability distribution of the first codeword given a set of possible values for the signal.

11. The method of claim 8, wherein the symbols are Quadrature Phase Shift Keying (QPSK) symbols.

12. An apparatus for embedded encoding of at least two types of information, comprising:
   a processor;
   memory in electronic communication with the processor;
   instructions stored in the memory, the instructions being executable by the processor to:
      determine a first error-correcting encoder and a second error-correcting encoder;
      determine the rates of the first encoder and the second encoder;
      generate a first codeword and a second codeword;
      determine a mapping rule for the second codeword and a coding rule for the first codeword;
      map the second codeword into a plurality of symbols using the mapping rule;
      determine a third codeword using the first codeword, the plurality of symbols, and the coding rule, wherein the coding rule defines a rotation around a constellation for the plurality of mapped symbols based on the first codeword; and
      transmit the third codeword, wherein the third codeword includes at least two types of information that require unequal error protection.

13. The apparatus of claim 12, wherein the constellation is a Quadrature Phase Shift Keying (QPSK) constellation.

14. The apparatus of claim 12, wherein the symbols are Quadrature Phase Shift Keying (QPSK) symbols.

15. The apparatus of claim 12, wherein the second encoder is a Turbo encoder.

16. The apparatus of claim 12, wherein the instructions executable to generate further comprise instructions to encode a first message with the first encoder and encode a second message with the second encoder.

17. The apparatus of claim 12, wherein the first encoder is a convolutional encoder.

18. A computer-readable medium for embedded decoding of a signal conveying at least two messages, the computer-readable medium comprising executable instructions for:
   receiving a signal;
   determining a first decoding rule for the signal;
   demodulating the signal;
   decoding the demodulated signal using the first decoding rule to produce a first message;
   encoding the first message to produce a first codeword;
   demapping the demodulated signal using the first codeword and a second decoding rule to produce a second codeword, wherein the second decoding rule defines a rotation around a constellation for the demodulated signal values based on the first code; and decoding the second codeword to produce a second message, wherein the first message and second message require unequal error protection.

19. The computer-readable medium of claim 18, wherein the first decoding rule is a probability distribution of the first codeword given a set of possible values for the signal.

20. The computer-readable medium of claim 18, wherein the constellation is a Quadrature Phase Shift Keying (QPSK) constellation, wherein the second decoding rule further comprises instructions for mapping the rotated signal values to produce the second codeword.

21. An apparatus for embedded decoding of a signal conveying at least two messages, comprising:
a processor;
memory in electronic communication with the processor;
instructions stored in the memory, the instructions being executable by the processor to:
receive a signal;
determine a first decoding rule for the signal;
demodulate the signal;
decode the demodulated signal using the first decoding rule to produce a first message;
encode the first message to produce a first codeword;
demap the demodulated signal using the first codeword and a second decoding rule to produce a second codeword, wherein the second decoding rule defines a rotation around a constellation for the demodulated signal values based on the codeword; and
decode the second codeword to produce a second message, wherein the first message and second message require unequal error protection.

22. The apparatus of claim 21, wherein the constellation is a Quadrature Phase Shift Keying (QPSK) constellation, wherein the second decoding rule further comprises instructions for mapping the rotated signal values to produce the second codeword.

23. The apparatus of claim 21, wherein the symbols are Quadrature Phase Shift Keying (QPSK) symbols.

24. The apparatus of claim 21, wherein the first decoding rule is a probability distribution of the first codeword given a set of possible values for the signal.

25. A computer-readable medium for embedded encoding of at least two types of information, the computer-readable medium comprising executable instructions for:
determining the types of a first encoder and a second encoder;
determining the rates of the first encoder and the second encoder;
generating a first codeword and a second codeword;
determining a mapping rule for the second codeword and a coding rule for the first codeword;
mapping the second codeword into a plurality of symbols using the mapping rule;
determining a third codeword using the first codeword, the plurality of symbols, and the coding rule, wherein the coding rule defines a rotation around a constellation for the plurality of mapped symbols based on the first codeword; and
transmitting the third codeword, wherein the third codeword includes at least two types of information that require unequal error protection.

26. The computer-readable medium of claim 25, wherein the constellation is a Quadrature Phase Shift Keying (QPSK) constellation.

27. The computer-readable medium of claim 25, wherein the instructions for generating further comprise instructions for encoding a first message with the first encoder and encode a second message with the second encoder.

* * * * *

UNITED STATES PATENT AND TRADEMARK OFFICE
CERTIFICATE OF CORRECTION

PATENT NO. : 7,907,070 B2
APPLICATION NO. : 12/210082
DATED : March 15, 2011
INVENTOR(S) : Wu et al.

It is certified that error appears in the above-identified patent and that said Letters Patent is hereby corrected as shown below:

In column 16, line 12 please delete "wherein constellation" and replace it with --wherein the constellation--.
    In column 17, line 3 please delete "code" and replace it with --codeword--.
    In column 17, line 31 please delete "the codeword" and replace it with --the first codeword--.

Signed and Sealed this
Twenty-eighth Day of June, 2011

David J. Kappos
*Director of the United States Patent and Trademark Office*